US010763048B2

(12) United States Patent
Kita

(10) Patent No.: US 10,763,048 B2
(45) Date of Patent: Sep. 1, 2020

(54) ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventor: Yukinori Kita, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Ihdustries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/327,048

(22) PCT Filed: Aug. 8, 2017

(86) PCT No.: PCT/JP2017/028708
§ 371 (c)(1),
(2) Date: Feb. 21, 2019

(87) PCT Pub. No.: WO2018/037905
PCT Pub. Date: Mar. 1, 2018

(65) Prior Publication Data
US 2019/0189360 A1 Jun. 20, 2019

(30) Foreign Application Priority Data
Aug. 22, 2016 (JP) .................... 2016-161757

(51) Int. Cl.
*H05K 1/14* (2006.01)
*H01G 9/08* (2006.01)
(Continued)

(52) U.S. Cl.
CPC ............ *H01G 9/08* (2013.01); *H01G 9/0003* (2013.01); *H02G 3/08* (2013.01); *H02G 3/081* (2013.01);
(Continued)

(58) Field of Classification Search
CPC .......... H01G 9/0003; H01G 9/08; H02G 3/08; H02G 3/081; H02G 3/16; H05K 1/162; H05K 7/20
See application file for complete search history.

(56) References Cited

U.S. PATENT DOCUMENTS 6,700,795 B1 * 3/2004 Jones ..................... H05K 1/141
307/10.8
2009/0137135 A1 * 5/2009 Yamaguchi .......... H01R 13/521
439/76.1
(Continued)

FOREIGN PATENT DOCUMENTS

JP 2007-242567 A 9/2007
JP 2008-147253 A 6/2008
(Continued)

OTHER PUBLICATIONS

International Search Report, Application No. PCT/JP2017/028708, dated Sep. 5, 2017.

*Primary Examiner* — Yuriy Semenenko
(74) *Attorney, Agent, or Firm* — Honigman LLP

(57) ABSTRACT

An electrical junction box includes: a connector housing that is to be fitted to a mating connector housing; a terminal held by a terminal holding portion provided in the connector housing; a first board connected to an end portion on an extension portion side of the terminal, the extension portion extending from the terminal holding portion toward a direction opposite to a fitting direction; a second board facing the first board; and a heat-generating component installed on the second board in the vicinity of the extension portion.

5 Claims, 5 Drawing Sheets

(51) Int. Cl.
    *H02G 3/16*     (2006.01)
    *H02G 3/08*     (2006.01)
    *H05K 7/20*     (2006.01)
    *H01G 9/00*     (2006.01)
    *H05K 1/16*     (2006.01)

(52) U.S. Cl.
    CPC ............... *H02G 3/16* (2013.01); *H05K 1/162* (2013.01); *H05K 7/20* (2013.01)

(56) References Cited

U.S. PATENT DOCUMENTS

| | | | |
|---|---|---|---|
| 2013/0119908 A1* | 5/2013 | Harada | H02P 6/10 |
| | | | 318/400.42 |
| 2016/0073534 A1* | 3/2016 | Kaminishi | H05K 7/026 |
| | | | 361/752 |
| 2016/0234928 A1* | 8/2016 | Nakamura | B60R 16/0238 |
| 2017/0155237 A1* | 6/2017 | Kobayashi | B60R 16/0239 |
| 2019/0123522 A1* | 4/2019 | Darr | H01H 85/20 |
| 2019/0132966 A1* | 5/2019 | Mitsui | H05K 5/0069 |

FOREIGN PATENT DOCUMENTS

| | | |
|---|---|---|
| JP | 2009-081180 A | 4/2009 |
| JP | 2013-038948 A | 2/2013 |
| JP | 2014-166089 A | 9/2014 |

\* cited by examiner

ELECTRICAL JUNCTION BOX

CROSS-REFERENCE TO RELATED APPLICATIONS

This application is the U.S. national stage of PCT/JP2017/028708 filed Aug. 8, 2017, which claims priority of Japanese Patent Application No. JP 2016-161757 filed Aug. 22, 2016.

TECHNICAL FIELD

The present disclosure relates to an electrical junction box.

BACKGROUND

A conventional electrical junction box is generally known as a means for distributing electric power from a shared power source in a vehicle to electronic units, and includes a plurality of bus bars that constitute a distribution circuit and devices such as a switching element integrated into the circuit. Examples of a circuit assembly housed in such an electrical junction box include a circuit assembly disclosed in JP 2005-151617A. This circuit assembly includes a circuit board and a heat dissipation member, which is for dissipating heat from the circuit board, overlaid on the circuit board.

Some elements disposed on a circuit board produce large amounts of heat. It is necessary to intensively dissipate more heat near such electronic components (heat-generating components) that generate large amounts of heat. However, in the conventional circuit assembly disclosed in JP 2005-151617A, a heat dissipation member is overlaid on the entire circuit board and heat overall can be released, but heat cannot be intensively dissipated from a specific portion of the board. Thus, the control apparatus disclosed in JP 2010-180702A is disclosed as being provided with a boss portion that protrudes from a case or a cover to a position near a component, and by applying an insulating heat transfer material to the boss portion, heat from the component can be transferred to the case or the cover. Furthermore, the case or cover of the control apparatus is provided with a protruding surface near a terminal, and by also applying the heat transfer material to the protruding surface, heat can be transferred from the case or the cover via the terminal to a wire harness connected to the terminal.

However, the control apparatus disclosed in JP 2010-180702A (Patent Document 2 listed below) needs to be provided with the protruding boss portion and the protruding surface in order to transfer heat from the component to the case or the cover, which imposes constraints on the design. Additionally, because a heat transfer material such as an adhesive agent needs to be applied to the boss portion and the protruding surface, the number of operation steps increases, and more work is involved because of the need to also increase positioning accuracy in order to reliably abut the boss portion and the protruding surface against each other so as to transfer heat.

SUMMARY

An electrical junction box disclosed in the present specification includes: a connector housing to be fitted to a mating connector housing; a terminal held by a terminal holding portion provided in the connector housing; a first board connected to an end portion on an extension portion side of the terminal, the extension portion extending from the terminal holding portion toward a direction opposite to a direction of fitting to the mating connector housing; a second board facing the first board; and a heat-generating component installed on the second board and disposed at a position that allows contact with or is in the vicinity of the extension portion.

In this configuration, the heat-generating component is installed at a position where it comes into to contact with or is in the vicinity of the extension portion of the terminal. Thus, heat generated by the heat-generating component can be released via the extension portion of the terminal to the first board connected to the terminal. Additionally, when the mating connector is fitted, heat can be released via the terminal and a wire connected to the mating terminal. Since the terminal is located in the vicinity of the heat-generating component, heat can be intensively dissipated from the heat-generating component. The heat dissipation amount is increased, and thus electronic components can be disposed in a highly dense manner. Furthermore, employing a simple configuration in which the heat-generating component is disposed at a position that allows the heat-generating component to come into contact with or be in the vicinity of the extension portion of the terminal enables an increase in efficiency of heat dissipation while reducing cost.

An embodiment of the electrical junction box disclosed in the present specification may also include the following configurations. A wall portion may extend from the connector housing to an area in the vicinity of the heat-generating component.

This configuration enables heat to be transferred via the wall portion to the connector housing where heat is dissipated and is thus capable of dissipating more heat.

The extension portion may include a parallel portion parallel to the second board, a bent portion bent from the parallel portion toward the first board, and a connection portion extending from the bent portion to the first board and connected to the first board, and the heat-generating component may be an electrolytic capacitor having a dimension, in a direction perpendicular to the second board, greater than a dimension from the second board to the parallel portion, the electrolytic capacitor being installed at a position in the neighborhood of the connection portion.

In this configuration, by disposing the electrolytic capacitor that has a height dimension and generates a large amount of heat at a position in the neighborhood of the connection portion of the terminal, heat can be transferred from the electrolytic capacitor to the terminal, and thus heat can be dissipated.

The extension portion may include a parallel portion parallel to the second board, a bent portion bent from the parallel portion toward the first board, and a connection portion extending from the bent portion to the first board and connected to the first board, and the heat-generating component may be a coil having a dimension, in a direction perpendicular to the second board, smaller than a dimension from the second board to the parallel portion, the coil being installed between the parallel portion and the second board.

In this configuration, by installing the coil that has a reduced height and generates a large amount of heat between the parallel portion of the terminal and the second board, heat can be transferred from the coil to the terminal, and thus heat can be dissipated. Also, dead space under the terminal can be utilized, thus achieving reduction in the size of the electrical junction box.

Advantageous Effects of Disclosure

An electrical junction box disclosed in the present specification enables the dissipation of heat from a heat-generating component.

DETAILED DESCRIPTION OF PREFERRED EMBODIMENTS

First Embodiment

A first embodiment is described with reference to FIGS. 1 to 4.

An electrical junction box 10 is disposed in a vehicle such as an electric car or a hybrid car, in a power supply path between a power source such as a battery and a load including vehicle electrical components such as a lamp or a drive motor, and can be used for a DC-DC converter or an inverter, for example. For the up-down (Z axis) direction and left-right (Y axis) direction used in the description provided below, see directions in FIG. 3. For the front-rear (X axis) direction, see FIG. 2 in which a forward direction is to the right and a rearward direction is to the left.

Figure 1:
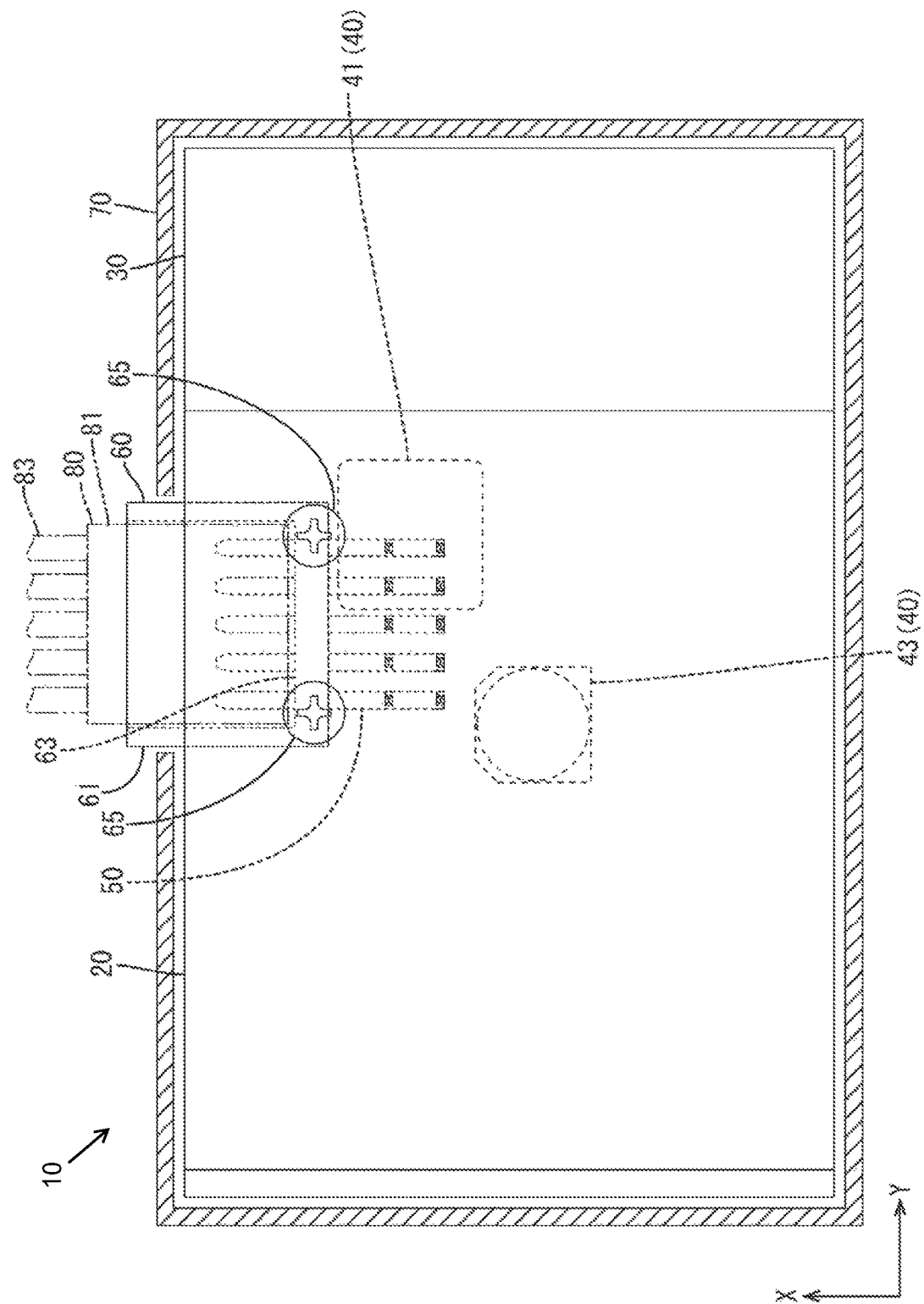
FIG. 1 is a horizontal cross-sectional view of an electrical junction box according to a first embodiment.
Figure 2:
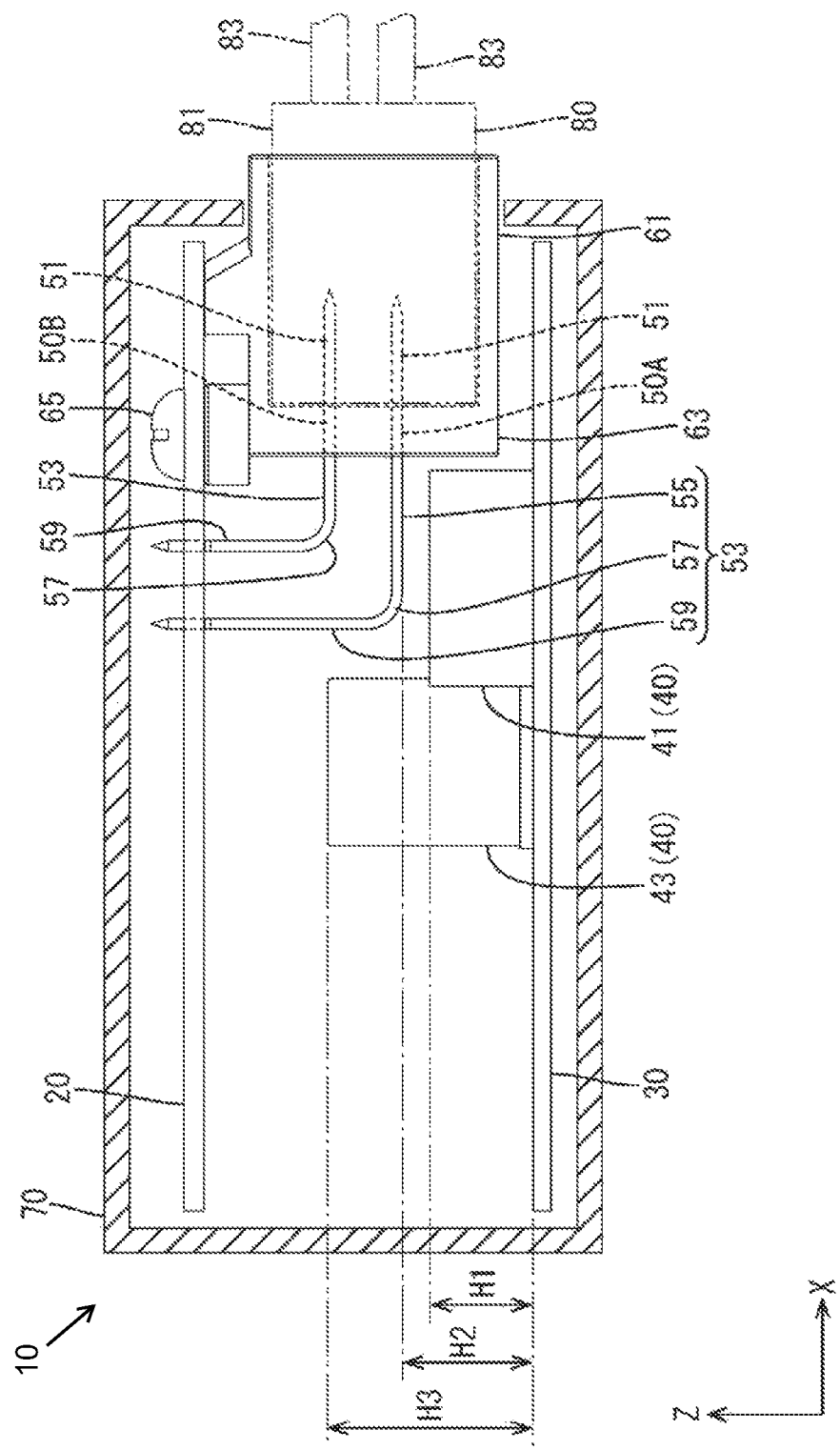
FIG. 2 is a vertical cross-sectional view of the electrical junction box.

As illustrated in FIGS. 1 and 2, the electrical junction box 10 includes a first board 20, a second board 30 disposed facing the first board 20, heat-generating components 40 installed on the second board 30, terminals 50 connected to the first board, a connector housing 60 that holds the terminals 50, and a case 70 that houses the first board 20 and the second board 30.

As illustrated in FIGS. 1 and 2, the second board 30 has a rectangular shape and is fitted into the case 70 and includes a printed board and a bus bar overlaid one on the other. The printed board includes an insulating board made of an insulating material, and a conductive path made of a material such as copper foil and formed on the insulating board using a printed wiring technique. The bus bar is formed by stamping a sheet metal made of a material such as copper alloy, in accordance with the shape of the conductive path. The printed board has a plurality of component insertion holes for connecting electronic components to the bus bar.

The conductive path provided on the second board 30 (printed board) is electrically connected to the heat-generating components 40 by using a well known technique such as soldering. The heat-generating components 40 include a switching element such as a field effect transistor (FET), a coil 41, and an electrolytic capacitor 43 to be described below. Illustration of heat-generating components is omitted except the coil 41 and the electrolytic capacitor 43.

Figure 3:
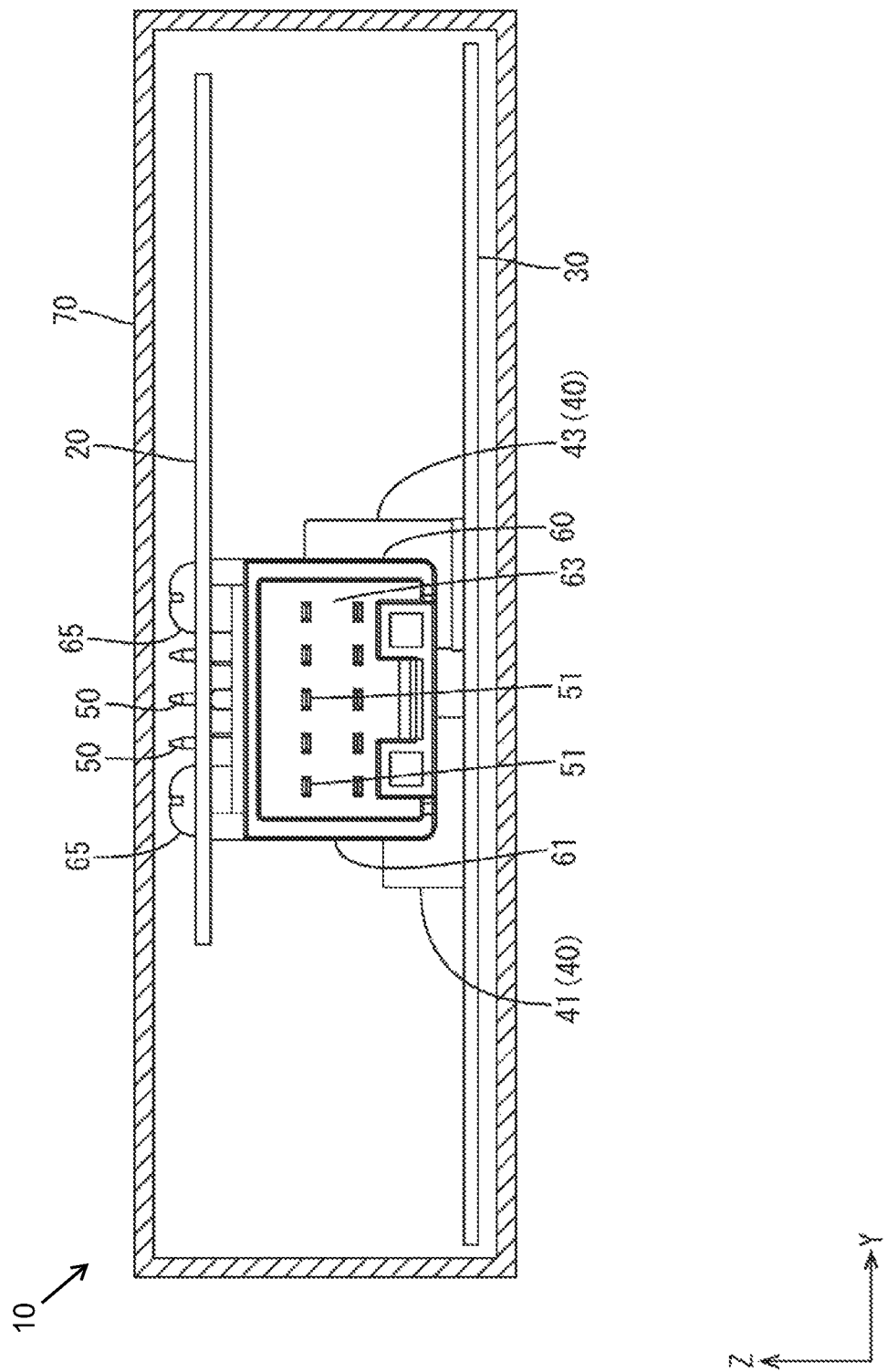
FIG. 3 is a cross-sectional view of the electrical junction box observed from a front direction.

As illustrated in FIGS. 1 and 3, the first board 20 is smaller in area than the second board 30 and is housed in the case 70 in an orientation parallel to and spaced apart from the second board 30 by a predefined distance in the up-down direction. The first board 20 has a rectangular shape and includes an insulating board made of an insulating material on which a conductive path made of copper foil or the like is formed by printed wiring, and with an electronic component mounted on the conductive path, serves as a control board for controlling, for example, a current flowing through the second board 30. The first board 20 is provided with through holes through which the terminals 50 are passed and at which the terminals 50 are connected thereto. The conductive path on the first board 20 is connected to the conductive path on the second board 30 by a plurality of connection terminals or the like.

Figure 4:
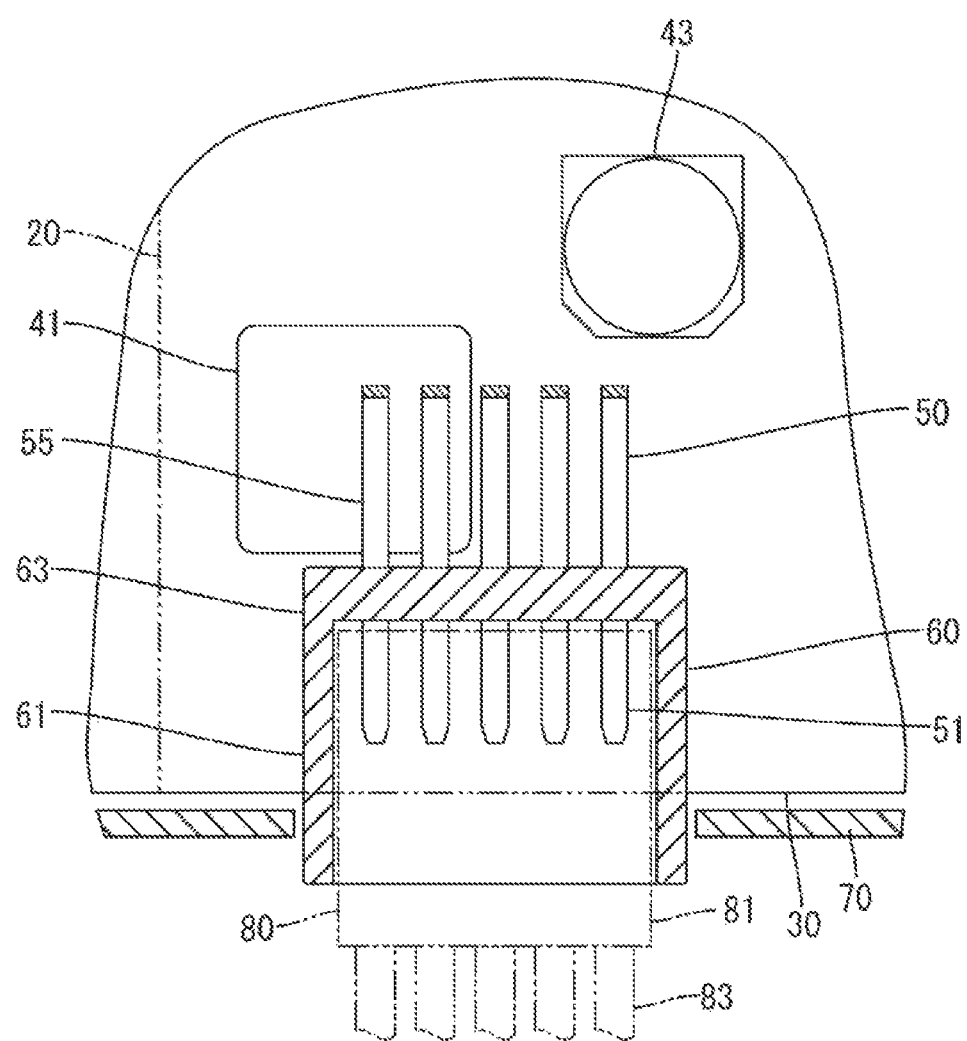
FIG. 4 is an enlarged cross-sectional view of a connector housing and its vicinity.

The coil 41 and the electrolytic capacitor 43 are described below as examples of the heat-generating components 40 in the present embodiment. Here, a heat-generating component 40 refers to an electronic component that produces heat when energized. Examples of the heat-generating components 40 include, for example, electronic components that produce a relatively large amount of heat and electronic components with insufficient heat dissipation capabilities due to reasons such as difficulty in being brought into direct contact with a bus bar. As illustrated in FIGS. 2 and 4, the coil 41 has a rectangular shape in plan view and a dimension (height dimension) H1 thereof in a direction perpendicular to the second board 30 (the up-down direction) is smaller than a dimension H2 from a parallel portion 55 of a lower terminal 50A, to be described below, to the second board 30. The electrolytic capacitor 43 includes a planar connection portion having a rectangular shape in plan view and a main body portion having a cylindrical shape placed on top of the connection portion, the two portions lending to the shape of the electrolytic capacitor 43. A dimension (height dimension) H3 of the electrolytic capacitor 43 in the up-down direction is greater than the dimension H1 of the coil 41 in the up-down direction and is greater than the dimension H2 from the parallel portion 55 of the lower terminal 50A to the second board 30.

As illustrated in FIGS. 2 and 3, ten terminals 50 in total are used split into two rows, in the up-down direction, of five in the left-right direction (a width direction). When these terminals are to be distinguished from each other using a reference sign, the terminals placed on the lower side (on a second board 30 side) are referred to as lower terminals 50A, and terminals placed on the upper side (on a first board 20 side) are referred to as upper terminals 50B. The terminals 50 are formed by bending a conductive material, having a rod-like shape, into an L shape. The terminals 50 are for allowing a control signal current to pass through the first board 20, which is a control board. The current is relatively small and thus the terminal 50 is relatively thin.

The terminals 50 each include a mating connection portion 51 and an extension portion 53. The extension portion 53 includes the parallel portion 55, a bent portion 57, and a connection portion 59. The mating connection portion 51 protrudes forward (in a direction of fitting to a mating connector housing 81) extending from a terminal holding portion 63 of the connector housing 60, to be described below, and is connected to a corresponding mating terminal. The parallel portion 55 protrudes rearward (toward a direction opposite to the direction of fitting to the mating connector housing 81) extending from the terminal holding portion 63 and thus is parallel to the second board 30. The parallel portion 55, which extends in the front-rear direction, is bent at a right angle toward the first board 20 (upward) at the bent portion 57, and thus the terminal 50 has an L shape overall. The connection portion 59 extends from the bent portion 57 to the first board 20 (upward) and passes through a through hole provided in the first board 20 to protrude upward from the first board 20, and is connected to the conductive path of the first board 20 through soldering or the like.

As illustrated in FIGS. 2 and 3, the connector housing 60 is fixed to the first board 20 by fastening screws 65. The connector housing 60 is made of a synthetic resin and includes a hood portion 61 having a rectangular tube-like shape externally fittable to the mating connector housing 81, and the terminal holding portion 63, which is for holding the terminals 50, is provided at a rear end portion of the hood portion 61. The hood portion 61 is open forward and has an internal shape that matches the external shape of the mating connector housing 81.

As illustrated in FIGS. 1 and 2, the case 70 has a rectangular box-like shape in plan view. The case 70 includes a holding member, made of synthetic resin, for holding the first board 20 and the second board 30, and a shield cover made of metal and attached on the holding member. A portion of the case 70 is provided with an opening and the connector housing 60 is disposed in the opening.

A mating connector 80 includes the mating terminal for connection with the mating connection portion 51 of the terminal 50, and the mating connector housing 81. The mating terminal is connected to a wire 83 drawn out rearward from the rear of the mating connector housing 81.

An assembly method and operation of the electrical junction box 10 according to the present embodiment having the above-described configuration are described below.

The second board 30 is housed in the case 70 and fixed thereto. The heat-generating components 40 including the coil 41 and the electrolytic capacitor 43 are then installed on the second board 30.

Then, the connector housing 60 and the terminals 50 are attached to the first board 20. The connector housing 60 holding the terminals 50 is disposed at a predetermined position on a lower surface of the first board 20, and the connection portions 59 of the terminals 50 are inserted into the through holes in the first board 20 and connected to the first board 20. At this point in time, the connector housing 60 holds the terminals 50 in a state where the extension portions 53 of the terminals 50 rearward of the terminal holding portion 63 are exposed. The connector housing 60 is then fixed to the first board 20 with the screws 65.

The first board 20, to which the connector housing 60 is attached, is disposed at a predetermined position over the second board 30. The first board 20 and the second board 30 are connected to each other using connection terminals, and the first board 20 is fixed to the case 70 and thus positioned. The extension portions 53 are in the vicinity of the heat-generating components 40 in this state. More specifically, the parallel portions 55 of the terminals 50 are located over the coil 41. In other words, the coil 41 is disposed between the parallel portions 55 and the second board 30. Additionally, the connection portions 59 of the terminals 50 are located in the neighborhood of the electrolytic capacitor 43. Note that the vicinity of the heat-generating components 40 refers to a range in which heat is transferred from the heat-generating components 40 to the extension portions 53 of the terminals 50, and refers to a state in which the extension portions 53 are in the neighborhood of the heat-generating components 40, and a state in which the extension portions 53 are located over or under the heat-generating components 40, and it is preferable that the extension portions 53 and the heat-generating components 40 are close to each other to an extent that they do not interfere with each other during, for example, assembly. Also, the neighborhood of the heat-generating components 40 refers to the vicinity of the heat-generating components 40 excluding areas over and under the heat-generating components 40.

Disposing the heat-generating components 40 in the vicinity of the extension portions 53 of the terminals 50 as described above enables heat to be transferred from the heat-generating components 40 via the terminals 50 and the mating terminal, to which the first board 20 and the terminals 50 are connected, to the wire 83, and thus dissipate heat. A first board 20 and a wire 83 in a conventional electrical junction box are not disposed in the vicinity of the heat-generating components 40 and thus do not contribute much to the dissipation of heat, whereas, in the electrical junction box according to the present embodiment, the first board 20 and the wire 83, to which heat is also transferred via the terminal 50, can contribute to the dissipation of heat. The terminals 50 are for passing a control signal current; thus, the amount of current flowing through the terminals 50 is not enough for the terminals 50 to produce heat and the terminals 50 therefore can absorb heat from the surrounding region (i.e., heat from the heat-generating components 40). Additionally, disposing a heat-generating component 40 having a small dimension in the up-down direction, such as the coil 41, under the terminals 50 can facilitate efficient use of dead space and thus reduce the size of the electrical junction box 10.

As described above, the heat-generating components 40 are installed in the vicinity of the extension portion 53 of the terminal 50 in the electrical junction box 10 according to the present embodiment. Heat generated by the heat-generating components 40 can thus be released via the extension portions 53 of the terminals 50 to the first board 20, which is connected to the terminals 50. When the mating connector 80 is fitted, heat can also be dissipated via the terminals 50 to the mating connector 80. Since the terminals 50 are located in the vicinity of the heat-generating components 40, heat can be intensively dissipated from the heat-generating components 40. The heat dissipation amount is increased, and thus electronic components can be disposed in a highly dense manner. Furthermore, employing a simple configuration in which the heat-generating components 40 are disposed in the vicinity of the extension portions 53 of the terminals 50 enables an increase in heat dissipation efficiency while reducing cost.

Modification

A modification of the first embodiment is described below with reference to FIG. 5. In the present modification, wall portions 67 are provided on the connector housing 60 and extend from the connector housing 60 to the vicinity of the heat-generating components 40. More specifically, the electrolytic capacitor 43 is disposed between the wall portions 67. Configurations apart from that described above are substantially similar to those in the first embodiment and thus the same elements are designated with the same symbols and their description is omitted below.

Figure 5:
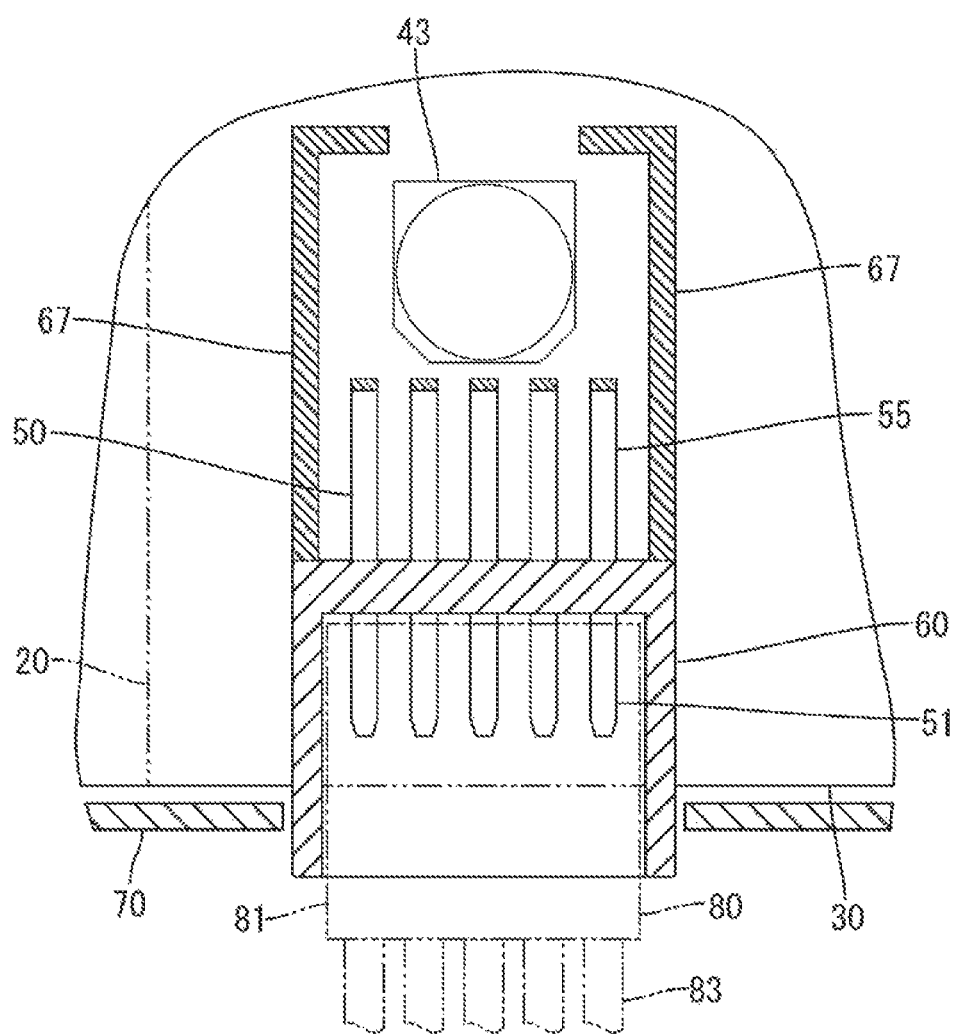
FIG. 5 is an enlarged cross-sectional view of the connector housing and its vicinity in a modification.

As illustrated in FIG. 5, the wall portions 67, which are separate from the connector housing 60, are attached to a rear end portion of the connector housing 60. The electrolytic capacitor 43 is interposed between the two wall portions 67, which are provided in the width direction. The wall portions 67 extend rearward from the rear end portion of the connector housing 60 past the electrolytic capacitor 43 and are bent inward in the width direction. By disposing the electrolytic capacitor 43 between the two wall portions 67, heat is transferred from the electrolytic capacitor 43 via the wall portions 67 to the connector housing 60 and dissipated therefrom.

Other Embodiments

The technology disclosed in the present specification is not limited to the embodiment described above with reference to the drawings; for example, various other embodiments, such as those in the following, are also included.

While the coil 41 and the electrolytic capacitor 43 are illustrated as examples of the heat-generating components 40 in the embodiment described above, the heat-generating components 40 may also be another electronic component.

While the terminals 50 are arranged in two rows in the up-down direction in the embodiment described above, the terminals 50 may also be arranged in one row or in three or more rows.

While the terminals 50 are for passing a control signal current in the embodiment described above, the terminal 50 may also be for other uses.

While the terminals 50 are bent at the bent portions 57 into an L shape in the embodiment described above, the terminals 50 may also have another shape.

While the heat-generating components 40 are disposed in the vicinity of the terminals 50 in the embodiment described above, the heat-generating components 40 may also be disposed at a position that allows the heat-generating components 40 to come into contact the terminals 50.

While the first board 20 is a control board and the second board 30 is a board on which a conductive path is formed in the embodiment described above, the first board may also be a board on which a conductive path is formed and the second board may be a control board. In other words, heat may also be transferred from a heat-generating component on a control board via a terminal of a connector for a power source circuit.

While the first board 20 is disposed over the second board 30 in the embodiment described above, the first board 20 may also be disposed under the second board 30.

While the connector housing 60 is fixed to the first board 20 in the embodiment described above, the connector housing 60 may also be fixed to the second board.

While a heat-generating component 40 is interposed between the two wall portions 67 in the modification of the embodiment described above, but the present disclosure is not limited to this. The number of wall portions 67 may also be one or more as long as the wall portion(s) 67 is/are disposed in the vicinity of the heat-generating component 40.

While the terminals 50 of the connector housing 60 according to the embodiment described above are passed through the through holes provided in the first board 20 and connected to the conductive path provided on the first board 20 through soldering or the like, but the present disclosure is not limited to this. A configuration may also be employed in which the terminals of the connector housing 60 are connected to a conductive path provided on the first board 20 or the second board 30 using a well known technique such as reflow soldering (so-called surface mounting).

The invention claimed is:

1. An electrical junction box comprising:
   a connector housing to be fitted to a mating connector housing;
   a terminal held by a terminal holding portion provided in the connector housing;
   a first board connected to an end portion on an extension portion of the terminal, the extension portion extending from the terminal holding portion toward a direction opposite to a direction of fitting to the mating connector housing;
   a second board spaced apart from the first board, wherein the connector housing is disposed between the first board and the second board so as to also place the extension portion of the terminal between the first and second board; and
   a heat-generating component installed on the second board and disposed at a position wherein heat generated by the heat-generating component is released to the first board by the extension portion.

2. The electrical junction box according to claim 1, wherein a wall portion extends from the connector housing to an area in the vicinity of the heat-generating component.

3. The electrical junction box according to claim 1, wherein the extension portion includes a parallel portion parallel to the second board, a bent portion bent from the parallel portion toward the first board, and a connection portion extending from the bent portion to the first board and connected to the first board, and
   the heat-generating component is an electrolytic capacitor having a dimension, in a direction perpendicular to the second board, greater than a dimension from the second board to the parallel portion, the electrolytic capacitor being installed at a position in the neighborhood of the connection portion.

4. The electrical junction box according to claim 1, wherein the extension portion includes a parallel portion parallel to the second board, a bent portion bent from the parallel portion toward the first board, and a connection portion extending from the bent portion to the first board and connected to the first board, and
   the heat-generating component is a coil having a dimension, in a direction perpendicular to the second board, smaller than a dimension from the second board to the parallel portion, the coil being installed between the parallel portion and the second board.

5. The electrical junction box according to claim 2, wherein the extension portion includes a parallel portion parallel to the second board, a bent portion bent from the parallel portion toward the first board, and a connection portion extending from the bent portion to the first board and connected to the first board, and
   the heat-generating component is an electrolytic capacitor having a dimension, in a direction perpendicular to the second board, greater than a dimension from the second board to the parallel portion, the electrolytic capacitor being installed at a position in the neighborhood of the connection portion.

* * * * *